(12) United States Patent
Kuramori

(10) Patent No.: US 7,020,023 B2
(45) Date of Patent: Mar. 28, 2006

(54) SEMICONDUCTOR INTEGRATED CIRCUIT

(75) Inventor: Bunsho Kuramori, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/964,642

(22) Filed: Oct. 15, 2004

(65) Prior Publication Data

US 2005/0083764 A1   Apr. 21, 2005

(30) Foreign Application Priority Data

Oct. 15, 2003   (JP)   ............................. 2003-355171

(51) Int. Cl.
*G11C 16/06*   (2006.01)
(52) U.S. Cl. ............................. 365/185.21; 365/189.07; 365/210
(58) Field of Classification Search ............ 365/185.21, 365/185.18, 189.01, 189.07, 189.09, 210
See application file for complete search history.

(56) References Cited

U.S. PATENT DOCUMENTS

| | | | |
|---|---|---|---|
| 5,694,353 A | 12/1997 | Koike | |
| 6,765,828 B1 * | 7/2004 | Yamashita | ............. 365/185.18 |
| 6,853,596 B1 * | 2/2005 | Cheung | ...................... 365/200 |
| 6,930,924 B1 * | 8/2005 | Takase et al. | .......... 365/185.28 |

* cited by examiner

*Primary Examiner*—Gene N. Auduong
(74) *Attorney, Agent, or Firm*—Nixon Peabody LLP; Donald R. Studebaker

(57) ABSTRACT

A semiconductor integrated circuit comprises a plurality of memory cell blocks each including a comparing cell which detects a current level and data cells which store data therein, a plurality of reference voltage determining circuits each of which determines a second reference voltage in accordance with a first reference voltage and the output of the comparing cell, and amplifiers each of which compares the data stored in the data cell and the output of the reference voltage determining circuit and amplifies the result of comparison. The outputs of the comparing cells are short-circuited in a predetermined combination. Owing to the configuration of the semiconductor integrated circuit, misdetection of each reading cell due to process variations related to each individual comparing cell can be prevented and yield enhancement can be achieved. Further, such a configuration leads to a cost reduction.

7 Claims, 7 Drawing Sheets

ENLARGED VIEW

ADJACENT BLOCKS AND SHORT CIRCUIT IN $V_{REF}$

ENLARGED VIEW

ADJACENT BLOCKS AND SHORT CIRCUIT IN $V_{REF}$

SHORT CIRCUIT IN BL FOR REF

ENLARGED VIEW

COMPARING CELL BL

MEMORY CELL BLOCK

SHORT CIRCUIT IN COMPARING CELL BL

ADJACENT BLOCKS AND SHORT CIRCUIT IN $V_{REF}$

ENLARGED VIEW

ADJACENT BLOCKS AND SHORT CIRCUIT IN $V_{REF}$

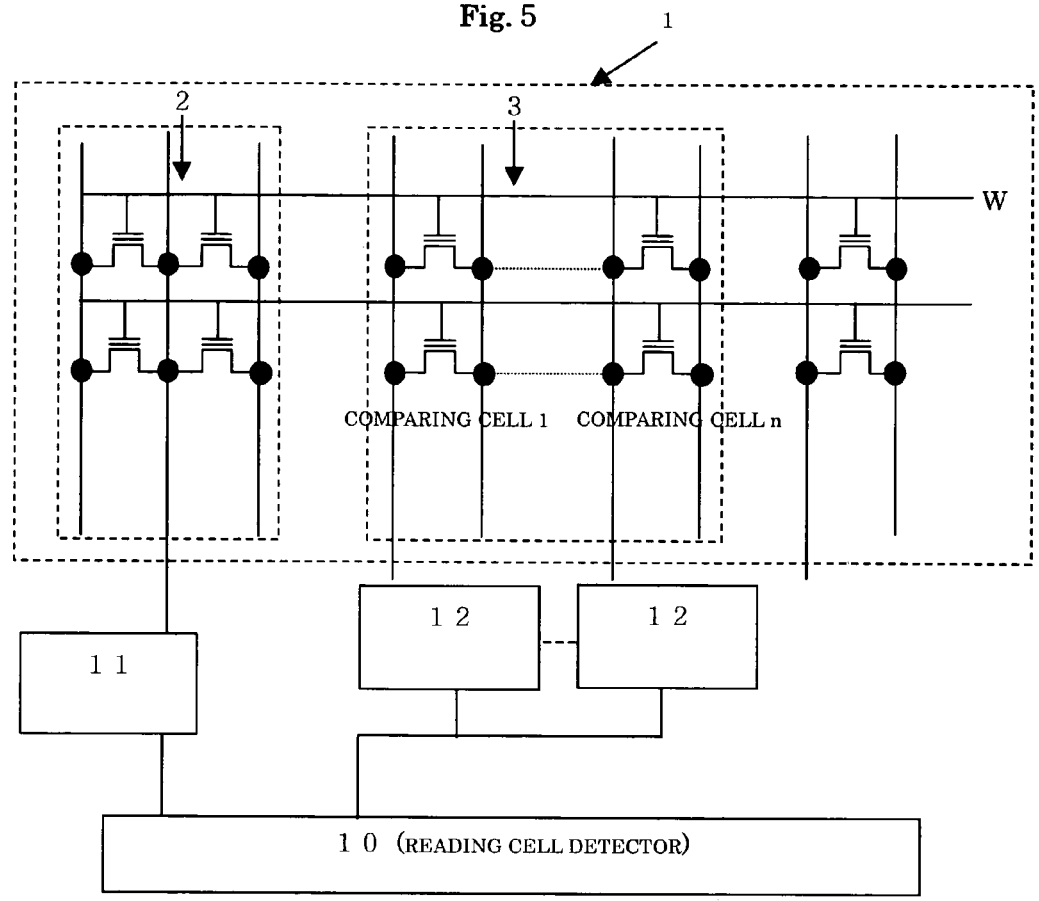
Fig. 5
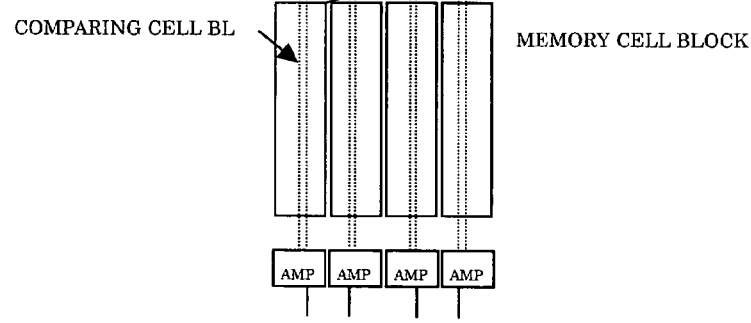
ENLARGED VIEW

SEMICONDUCTOR INTEGRATED CIRCUIT

BACKGROUND OF THE INVENTION

1. Field of the Invention

The present invention relates to a non-volatile memory device, specifically, an EEPROM, and particularly to a method of controlling a reference voltage which refers to stored information upon its reading.

2. Description of the Related Art

As shown in FIG. 6, the non-volatile memory device has heretofore been provided with current comparing cells disposed in one respective cell blocks in one rows and circuits each of which compares a current flowing through one comparing cell and a current flowing through one cell that reads stored information to thereby determine 0 or 1. Details of an AMP's circuit shown in FIG. 6 are given as illustrated in FIG. 7. An AMP10 includes an AMP1, an AMP2 and an AMP3. The AMP1 is provided with a reading detector and a comparing detector. The comparing detector is twice as large in dimension as the reading detector. The current always flows in the corresponding comparing cell connected to the comparing detector without information being written therein.

When 1 indicative of stored information is read, the same current is caused to flow through a cell for reading the stored information and a comparing cell, and a current flowing from a comparing BL is always added to a current that flows through the comparing detector. Therefore, an AMP1 output outputted from the reading detector results in a value higher than $V_{REF}$ due to the ratio between the dimensions of the reading detector and the comparing detector. When 0 indicative of stored information is read in reverse, no current flows through the corresponding cell for reading the stored information, and hence the AMP1 output becomes lower than $V_{REF}$. Incidentally, $V_{REF}$ becomes an intermediate potential of the AMP1 output where 1 and 0 of the stored information are read. The contents referred to above have been described in, for example a patent document 1 (Japanese Unexamined Patent Publication No. Hei 09(1997)-097496).

However, the AMP10 might cause a malfunction. Even though a reading cell is found not to be defective, it might be detected as defective. The following two examples are considered as malfunction's mechanisms.

The first example shows the case in which a comparing cell is reduced in current at its turning-on due to its process variations and an information reading cell increases in off leak current due to its process variations. As a result of the reduction in the current flowing through the comparing cell, the value of $V_{REF}$ become low. As a result of the increase in the current flowing through the reading cell, the AMP1 output becomes high and hence the AMP1 output exceeds the value of $V_{REF}$, so that the AMP10 is considered to lead to the malfunction.

The second example shows the case in which a comparing cell increases in current at its turning-on due to its process variations and an information reading cell is reduced in on current due to its process variations. As a result of the increase in the current flowing through the comparing cell, the value of $V_{REF}$ becomes large. As a result of the reduction in the current flowing through the reading cell, the AMP1 output becomes small and hence the AMP1 output exceeds the value of $V_{REF}$, so that the AMP10 is considered to lead to the malfunction.

The two cases arise together where the process variations related to the comparing and reading cells are noticeable. If the process variations related to either the comparing cell or the reading cell can be less reduced, then the present problem can be solved.

SUMMARY OF THE INVENTION

The present invention has been made in view of the foregoing. Thus, it is an object of the present invention to provide a semiconductor integrated circuit which is capable of solving the foregoing problems and averaging process variations related to individual comparing cells.

According to one aspect of the present invention, for achieving the object, there is provided a semiconductor integrated circuit comprising:

a plurality of memory cell blocks each including a comparing cell which detects a current level and data cells which store data therein;

a plurality of reference voltage determining circuits each of which determines a second reference voltage in accordance with a first reference potential and the output of the comparing cell; and amplifiers each of which compares the data stored in the data cell and the output of the reference voltage determining circuit and amplifies the result of comparison, wherein the outputs of the comparing cells are short-circuited in predetermined combination.

With the use of the semiconductor integrated circuit of the present invention, it is possible to prevent misdetection of a reading cell due to process variations related to each comparing cell and achieve yield enhancement. Further, the use thereof leads to a reduction in cost.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 5 is a block diagram showing a semiconductor integrated circuit according to a third embodiment of the present invention;

DETAILED DESCRIPTION OF THE PREFERRED EMBODIMENTS

Preferred embodiments of the present invention will hereinafter be described with reference to the accompanying drawings.

First Preferred Embodiment

Figure 1:
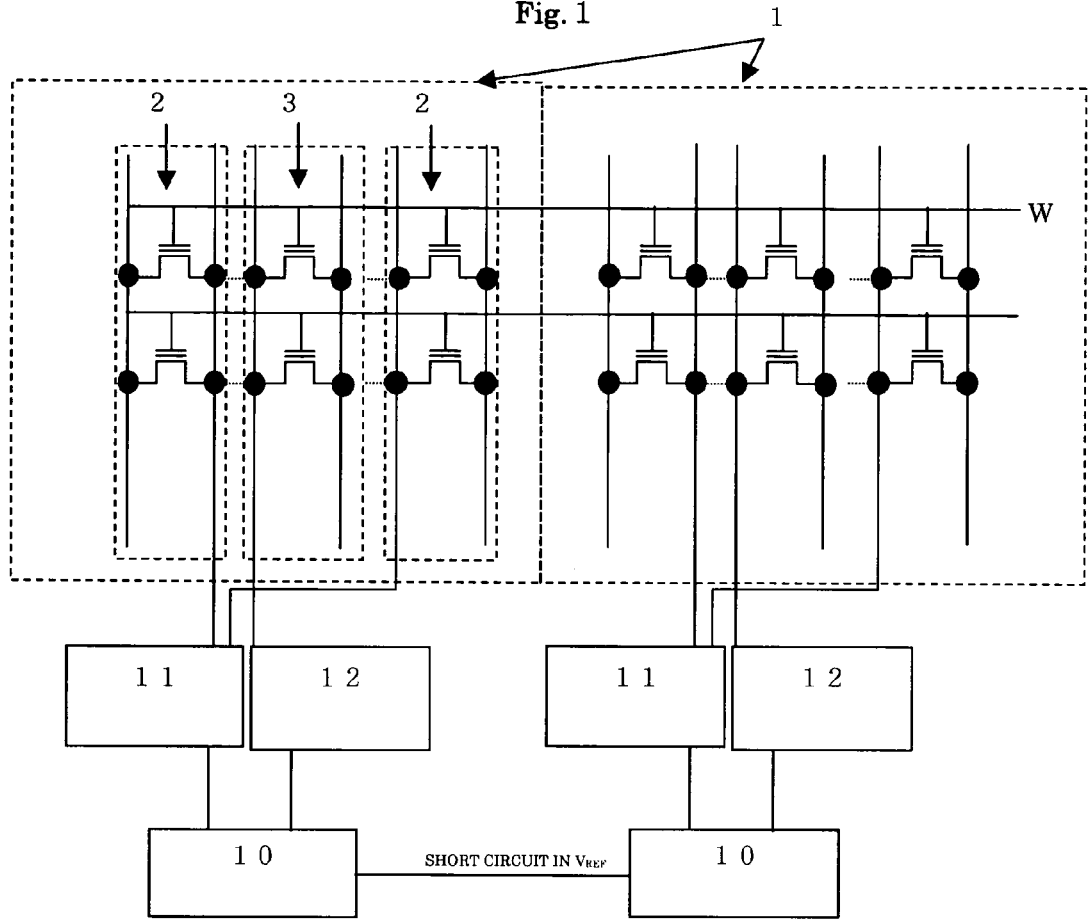
FIG. 1 is a block diagram showing a semiconductor integrated circuit according to a first embodiment of the present invention.
Figure 1:
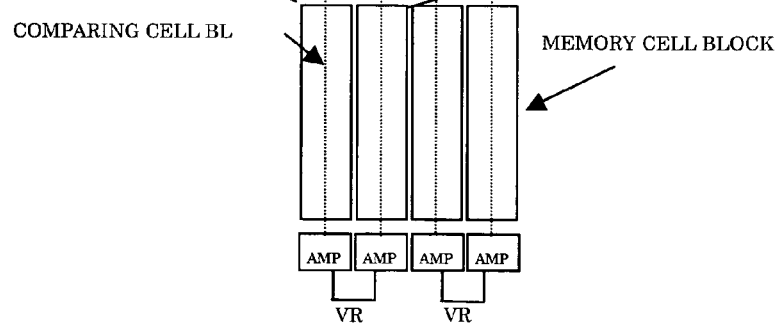

FIG. 1 is a block diagram showing a first embodiment of the present invention. A semiconductor integrated circuit according to the first embodiment of the present invention is provided, in plural form, with memory cell blocks 1 each comprising a comparing cell 3 and data cells 2, BL selection circuits 11 which select bit lines (hereinafter called "BLs") of the respective data cells 2, comparing cell BL transfers 12 each of which selects the bit line BL for the comparing cell, and amplifiers 10 each of which accepts and amplifies the outputs of the BL selection circuit 11 and the BL transfer 12 for the comparing cell. The amplifier 10 includes a first reading detector which outputs an AMP1 output in accordance with the output of the BL selection circuit 11, a comparing detector which outputs a reference voltage (hereinafter called "$V_{REF}$") in accordance with the output of the comparing cell BL transfer 12, and a differential amplifier which amplifies the difference between the AMP1 output and $V_{REF}$ in response to the AMP1 output and $V_{REF}$ and outputs the result of amplification.

$V_{REFs}$ of the respective amplifiers 10 are being short-circuited in a predetermined combination. Although the combination is not limited in particular, $V_{REFs}$ are averaged as the number of outputs to be short-circuited increases. FIG. 1 shows an example in which $V_{REFs}$ of the amplifiers 10 each corresponding to the two cell blocks adjacent to each other are short-circuited. Each of the amplifiers 10 is identical to the conventional one in operation. Since, however, $V_{REFs}$ adjacent to each other are being short-circuited, $V_{REFs}$ are averaged even if variations in currents flowing through the comparing cells due to process variations lean to either one side. Thus, $V_{REF}$ results in a value closer to the normal value. In the present embodiment, the variations can be suppressed to half. Thus, ones judged to be defective result only in comparing cells in which currents flowing therethrough are significantly shifted.

Figure 2:
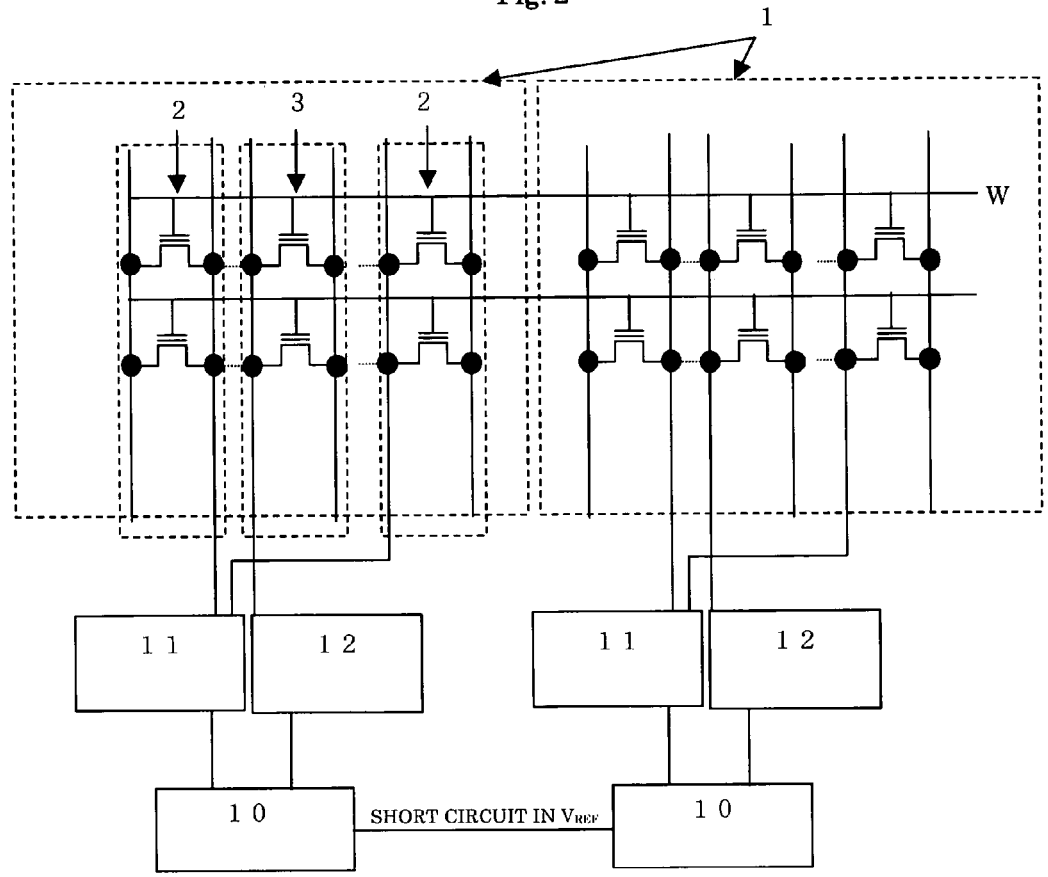
FIG. 2 is a modification of the block diagram showing the semiconductor integrated circuit according to the first embodiment of the present invention.
Figure 2:
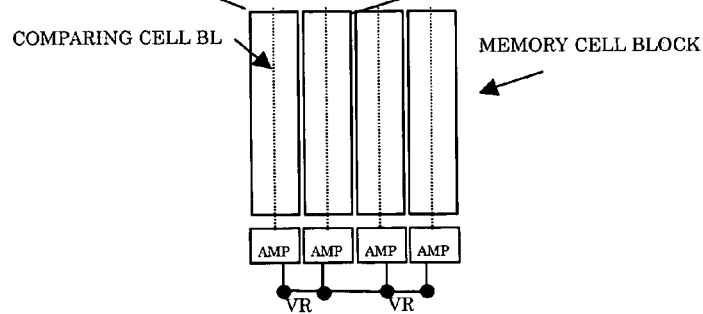

FIG. 2 is an example in which $V_{REFs}$ of all amplifiers 10 are short-circuited. There is a possibility that particularly when the number of short-circuited $V_{REFs}$ increases, $V_{REFs}$ will be averaged and the normal operation will fall within a possible range if comparing cells of other memory cell blocks 1 are normal even where comparing cells are brought to cells regarded as being perfectly defective as well as being subjected to process variations. Thus, it is possible to achieve an improvement in yield.

Second Preferred Embodiment

Figure 3:
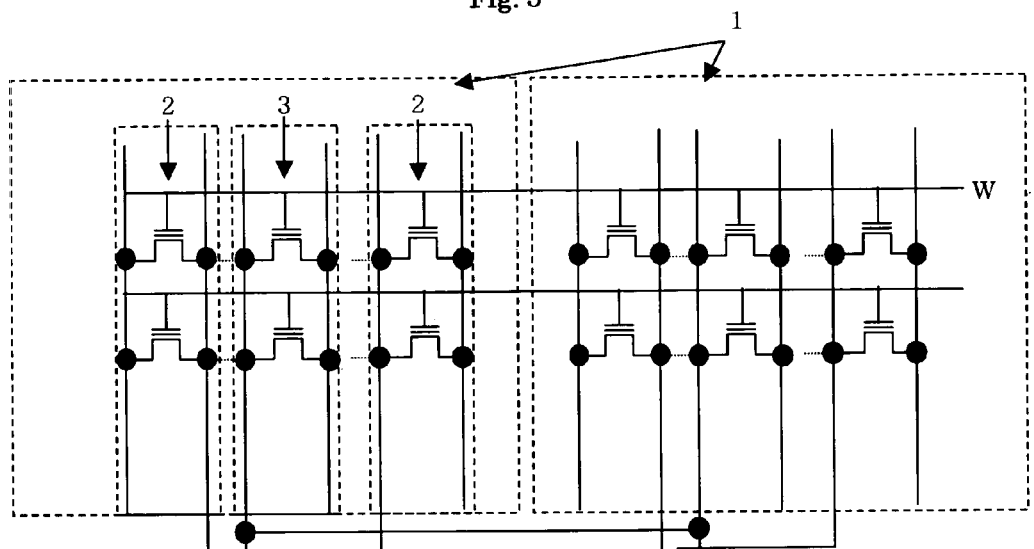
FIG. 3 is a block diagram illustrating a semiconductor integrated circuit according to a second embodiment of the present invention.
Figure 3:
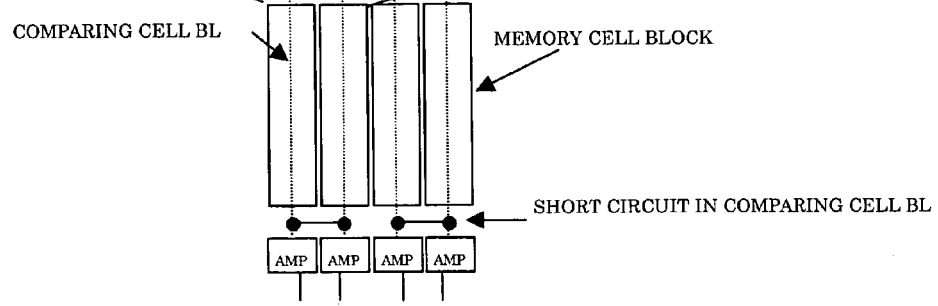

FIG. 3 is a block diagram showing a second embodiment of the present invention. The locations of components similar to those employed in the first embodiment are given like reference numerals. A semiconductor integrated circuit according to the second embodiment of the present invention is provided, in plural form, with memory cell blocks 1 each comprising a comparing cell 3 and data cells 2, BL selection circuits 11 which respectively select bit lines (hereinafter called "BLs") for the respective data cells 2, comparing cell BL transfers 12 which select the comparing cell BLs, and amplifiers 10 each of which accepts and amplifies the outputs of the BL selection circuit 11 and the comparing cell BL transfer 12. The amplifier 10 includes a first reading detector which outputs an AMP1 output in accordance with the output of the BL selection circuit 11, a comparing detector which outputs $V_{REF}$ in accordance with the output of the comparing cell BL transfer 12, and a differential amplifier which amplifies the difference between the AMP1 output and $V_{REF}$ in response to the AMP1 output and $V_{REF}$ and outputs the result of amplification.

In the second embodiment, $V_{REF}$ short-circuited in the first embodiment is substituted with the output of the BL selection circuit 11. Since the short-circuited spot can be changed as needed, the present embodiment can easily be used in light of a design advantage.

Figure 4:
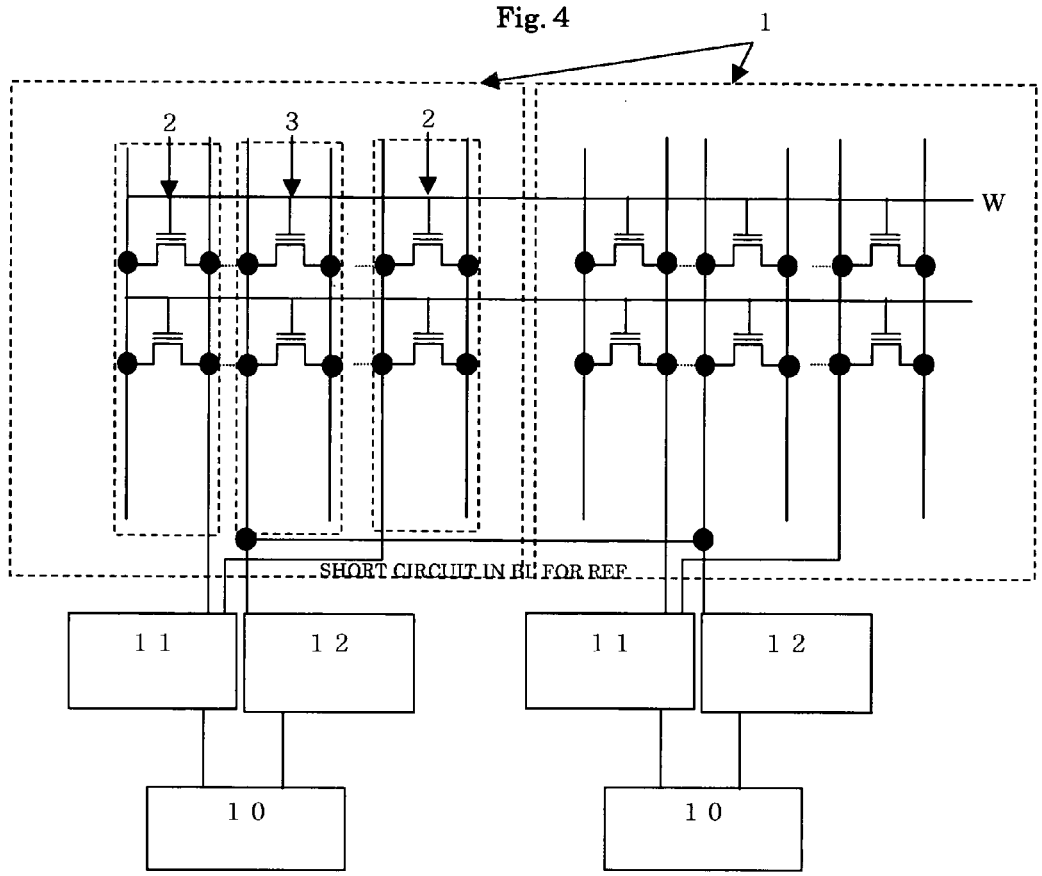
FIG. 4 is a modification of the block diagram illustrating the semiconductor integrated circuit according to the second embodiment of the present invention.
Figure 4:
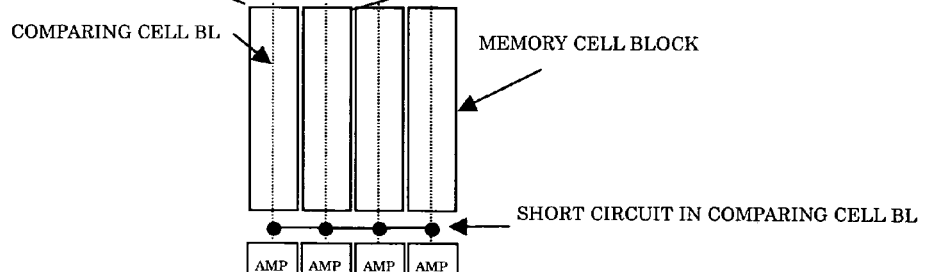
Figure 6:
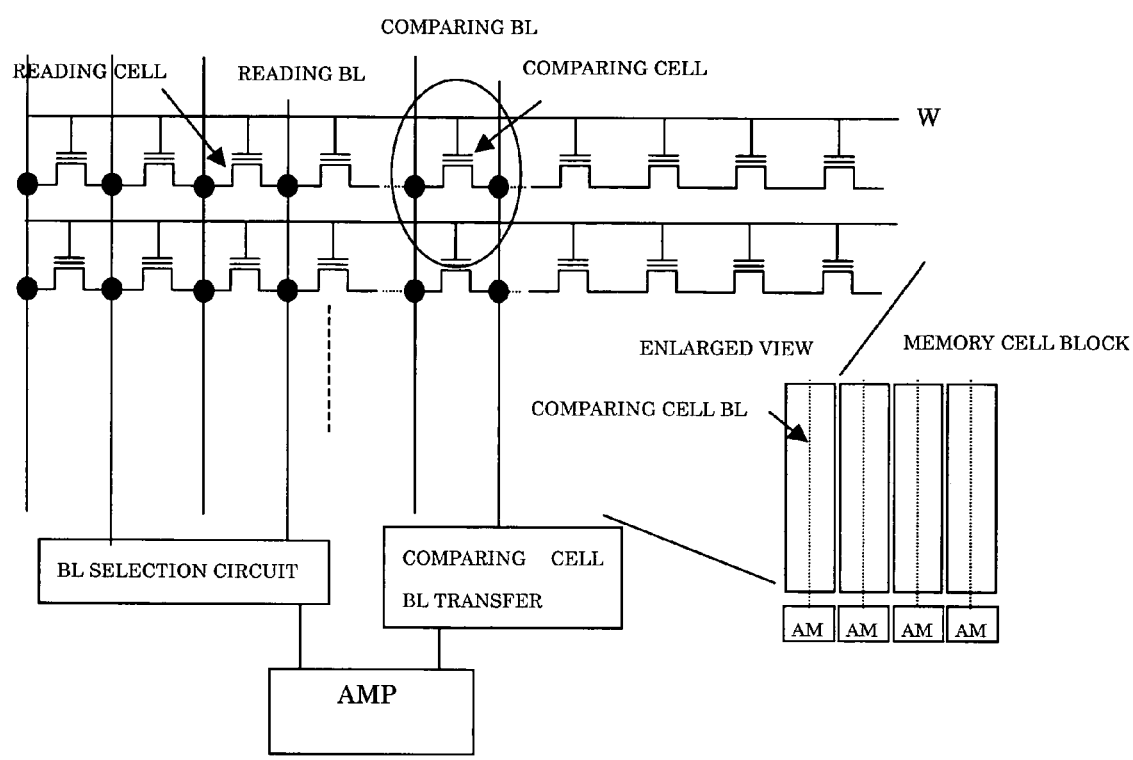
FIG. 6 is a block diagram illustrating a semiconductor integrated circuit related to a prior art, of the present invention.
Figure 7:
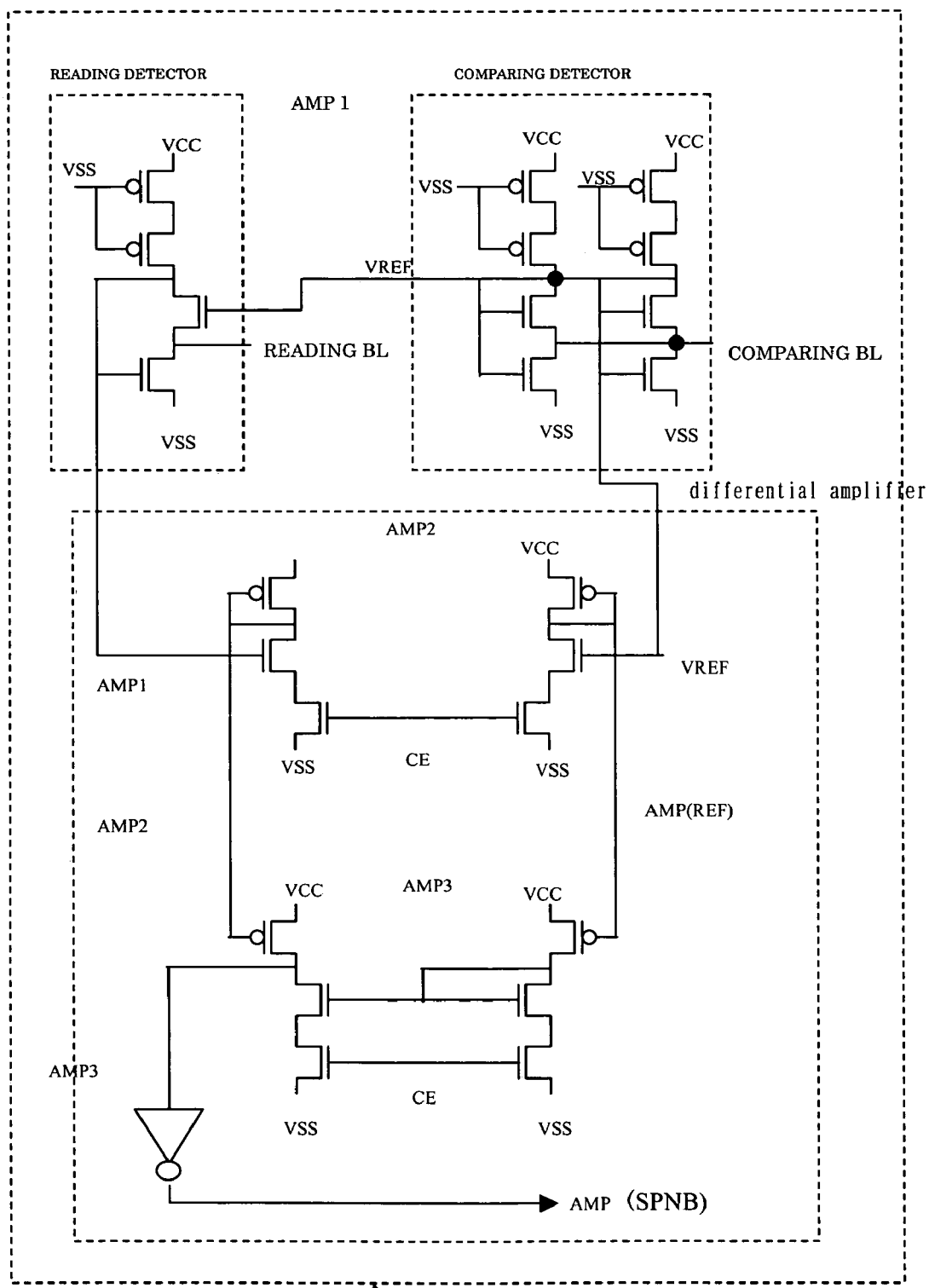
FIG. 7 is a detailed circuit diagram showing an amplifier 10 according to the present invention.

Besides, the outputs of all the BL selection circuits 11 can be further averaged by being short-circuited as shown in FIG. 4.

Third Preferred Embodiment

FIG. 5 is a block diagram showing a third embodiment of the present invention. The difference between the first embodiment and the third embodiment resides in that a plurality of rows of comparing cells are formed in one memory cell block 1. With the formation of the plurality of rows of comparing cells, the values of $V_{REFs}$ are further averaged.

It is, as a matter of course, needless to say that a similar advantageous effect is obtained even in the case of the contents of a combination of the first, second and third embodiments.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor integrated circuit comprising:
   a plurality of memory cell blocks each including a comparing cell which detects a current level and data cells which store information therein;
   a plurality of reference voltage determining circuits each of which determines a second reference voltage in accordance with a first reference potential and the output of the comparing cell; and
   amplifiers each of which compares the information stored in the data cell and the output of the reference voltage determining circuit and amplifies the result of comparison,
   wherein the outputs of the comparing cells are short-circuited in a predetermined combination.

2. The semiconductor integrated circuit according to claim 1, wherein the predetermined combination is set among the outputs of the plurality of comparing cells respectively included in the plurality of memory cell blocks adjacent to one another.

3. The semiconductor integrated circuit according to claim 1, wherein the predetermined combination is set among the outputs of all comparing cells of the plurality of memory cell blocks included in the semiconductor integrated circuit.

4. A semiconductor integrated circuit comprising:
   a plurality of memory cell blocks each including a comparing cell which detects a current level and data cells which store data therein;
   a plurality of reference voltage determining circuits each of which determines a second reference voltage in accordance with a first reference potential and the output of the comparing cell; and amplifiers each of which compares the data stored in the data cell and the output of the reference voltage determining circuit and amplifies the result of comparison, wherein the outputs of the amplifiers are short-circuited in a predetermined combination.

5. The semiconductor integrated circuit according to claim 4, wherein the predetermined combination is set among the outputs of the amplifiers adjacent to one another.

6. The semiconductor integrated circuit according to claim 4, wherein the predetermined combination is set among the outputs of all the amplifiers contained in the semiconductor integrated circuit.

7. The semiconductor integrated circuit according to claim 1 or 4, wherein a plurality of rows of the comparing cells are formed in one of the memory cell blocks, and the comparing cells in the memory cell block are respectively short-circuited.

* * * * *